(12) United States Patent
Dyer

(10) Patent No.: US 7,999,708 B2
(45) Date of Patent: Aug. 16, 2011

(54) ANALOG CORRECTION OF A PHASE-MISMATCH IN HIGH-SAMPLE RATE TIME-INTERLEAVED ANALOG-TO-DIGITAL CONVERTERS

(75) Inventor: Kenneth C. Dyer, Davis, CA (US)

(73) Assignee: Vintomie Networks B.V., LLC, Dover, DE (US)

( * ) Notice: Subject to any disclaimer, the term of this patent is extended or adjusted under 35 U.S.C. 154(b) by 0 days.

(21) Appl. No.: 12/631,531

(22) Filed: Dec. 4, 2009

(65) Prior Publication Data
US 2010/0085226 A1    Apr. 8, 2010

Related U.S. Application Data

(63) Continuation of application No. 12/009,324, filed on Jan. 16, 2008, now Pat. No. 7,629,905.

(60) Provisional application No. 60/900,180, filed on Feb. 7, 2007.

(51) Int. Cl.
*H03M 1/06* (2006.01)

(52) U.S. Cl. .......................... 341/118; 341/155

(58) Field of Classification Search .................. 341/118, 341/155, 161, 120.143
See application file for complete search history.

(56) References Cited

U.S. PATENT DOCUMENTS

| 7,068,195 B1 | 6/2006 | Menkus | 341/141 |
|---|---|---|---|
| 7,126,511 B2 * | 10/2006 | Draxelmayr et al. | 341/136 |
| 7,233,270 B2 | 6/2007 | Lin | 341/118 |
| 7,466,251 B2 | 12/2008 | Uchino | 341/120 |
| 7,692,459 B2 * | 4/2010 | Lee | 327/149 |
| 2008/0084337 A1 | 4/2008 | Batruni | 341/118 |

* cited by examiner

*Primary Examiner* — Brian Young
(74) *Attorney, Agent, or Firm* — Dorsey & Whitney LLP

(57) ABSTRACT

A method of phase mismatch correction in high-sample rate time-interleaved analog-to-digital converters (ADC) is provided. An ADC parallel array has an output signal that is processed by a phase-mismatch detector. The detector drives a clock generator control circuit for the ADC array. The clock generator includes a common mode logic (CML) buffer, a CMOS, a non-overlapping generator, a DAC and a decimating low-pass filter. The CML receives a reference clock signal providing source line control (SLC) to the CMOS, the CMOS provides SLC to the DAC that is controlled by the filter which receives a digital control signal from the phase mismatch detector. The DAC provides a corrected timing input to the CMOS that provides the corrected timing signal to the non-overlap generator, where a delay in the clock path is modified and the signal path is unaltered.

20 Claims, 2 Drawing Sheets

ANALOG CORRECTION OF A PHASE-MISMATCH IN HIGH-SAMPLE RATE TIME-INTERLEAVED ANALOG-TO-DIGITAL CONVERTERS

CROSS-REFERENCE TO RELATED APPLICATIONS

This application is a continuation of U.S. patent application Ser. No. 12/009,324, filed Jan. 16, 2008, which claims the benefit from U.S. Provisional Patent Application No. 60/900,180 filed Feb. 7, 2007. These applications are incorporated by reference herein in their entirety and for all purposes.

FIELD OF THE INVENTION

The invention relates generally to analog-to-digital converters (ADC). More particularly, the invention relates to sample time mismatch correction between ADC's in an array.

BACKGROUND

High data rate communication applications require high-speed, high-resolution analog-to-digital converters (ADCs) in a time-interleaved architecture. Time-interleaved architectures provide a benefit of increased sampling rate for an analog signal. Time-interleaved ADCs also generally provide conversion-related errors due to sample time mismatches among channel ADCs that occur in timing. Sample time mismatch errors are a primary limiting factor and give rise to higher noise in the overall output.

Accordingly, there is a need to develop a way to correct timing errors inherent in the use of multiple ADCs in a time-interleaved architecture.

SUMMARY OF THE INVENTION

The current invention provides a method of phase mismatch correction in high-sample rate time-interleaved analog-to-digital converters (ADC). In one embodiment, the invention provides at least two the ADC's in a parallel array, where the ADC array has an array output signal and the array output signal is processed with a phase-mismatch detector. The phase-mismatch detector drives a control circuit for a clock generator for the ADC array, where a delay in a clock path is modified and a signal path is unaltered.

In one aspect of the invention, the control circuit includes a decimating low-pass filter of a clock generator for the ADC array, where the decimating low-pass filter controls a digital-to-analog converter (DAC).

In another aspect of the invention, the clock generator includes a common mode logic buffer, a CMOS, a non-overlapping generator, a DAC and a decimating low-pass filter. The common mode logic buffer is disposed to receive a reference clock signal from a clock generator of the ADC array and further disposed to provide source line control (SLC) to a CMOS, where the DAC is disposed to receive the SLC from the CMOS, and the DAC is controlled by the decimating low-pass filter. The filter receives a digital control signal from the phase mismatch detector, where the DAC provides a corrected timing input to the CMOS. The CMOS provides the corrected timing signal to the non-overlap generator, where a delay in the clock path is modified and the signal path is unaltered.

In a further aspect of the invention, the decimating low-pass filter is a random-walk filter.

BRIEF DESCRIPTION OF THE FIGURES

The objectives and advantages of the present invention will be understood by reading the following detailed description in conjunction with the drawing, in which.

DETAILED DESCRIPTION OF THE INVENTION

Although the following detailed description contains many specifics for the purposes of illustration, anyone of ordinary skill in the art will readily appreciate that many variations and alterations to the following exemplary details are within the scope of the invention. Accordingly, the following preferred embodiment of the invention is set forth without any loss of generality to, and without imposing limitations upon, the claimed invention.

The sample-time mismatch between any two ADC's in an array can be corrected by introducing a small correction current in the clock generator. This correction current is determined in the digital domain at a reduced sample rate by a digital circuit. The input signal bandwidth need not be limited to below half-sample frequency (FS/2) of the array sample rate. The technique can be done adaptively and in the background without interruption of the input signal.

Figure 1:
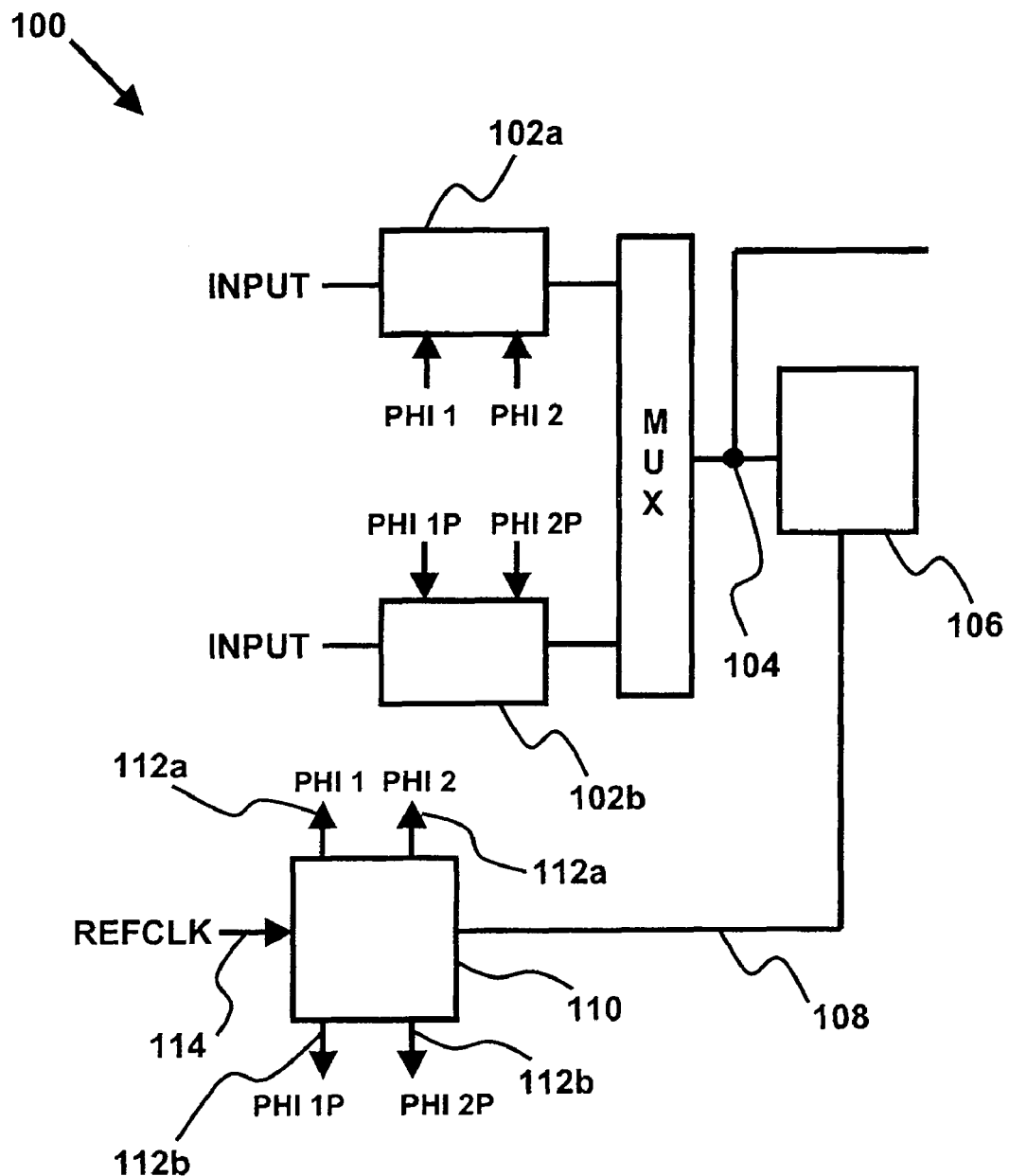
FIG. 1 shows a block diagram of the time interleaved ADC array having sample-time mismatch correction according to the present invention.

FIG. 1 shows a top-level diagram of a two-channel interleaved ADC array 100 having sample-time mismatch correction according to the present invention, where the array 100 can be extended to more than two ADC's 102(a, b). As shown, at least two the ADC's 102(a, b) are in a parallel array, where the ADC array 100 has an array output signal 104 that is processed with a phase-mismatch detector 106. The phase-mismatch detector 106 provides a digital control signal 108 to drive a control circuit 200 (see FIG. 2) for a clock generator 110 for the ADC array 100, where a delay in a clock path 112a is modified relative to clock path 112b and both are derived from clock path 114.

Figure 2:
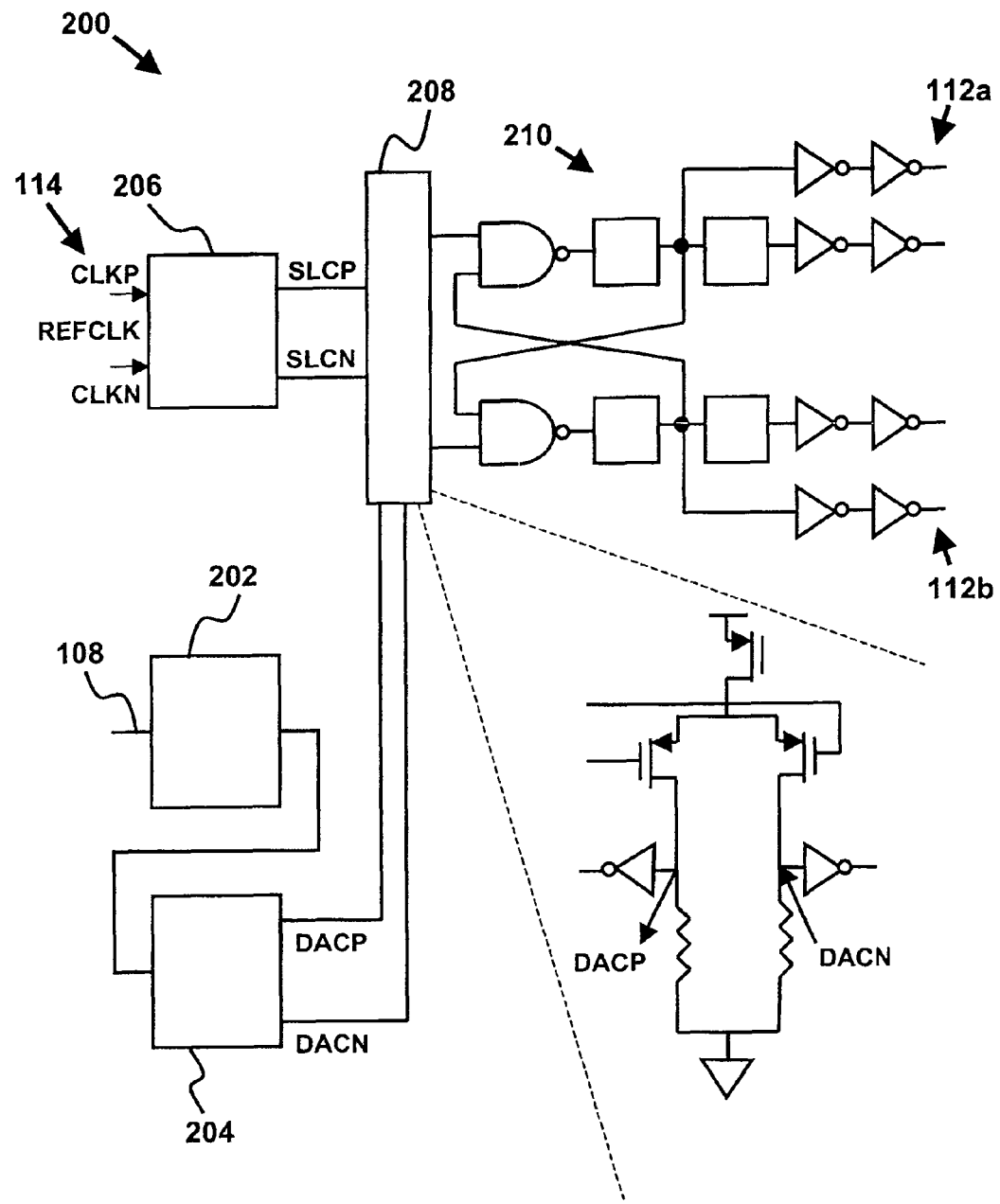
FIG. 2 shows an ADC clock generator of the time interleaved ADC array having sample-time mismatch correction according to the present invention.

FIG. 2 shows the control circuit 200 that includes a decimating low-pass filter 202 of the clock generator 110 for the ADC array 100, where the decimating low-pass filter 202 controls a digital-to-analog converter (DAC) 204. The clock generator 110 includes a common mode logic buffer 206, a CMOS 208, a non-overlapping generator 210, a DAC 204 and a decimating low-pass filter 202. The common mode logic buffer 206 is disposed to receive a reference clock signal 114 from the clock generator (not shown) of the ADC array 100 and further disposed to provide source line control (SLC) 210 to the CMOS 208, where the DAC 204 is disposed to receive the SLC 210 from the CMOS 208, and the DAC 204 is controlled by the decimating low-pass filter 202. The filter 202 receives a digital control signal 108 from the phase mismatch detector 106, where the DAC 204 provides a corrected timing input to the CMOS 208. The CMOS 208 provides the corrected timing signal to the non-overlap generator 210, where a delay in the clock path is modified and the signal path is unaltered, thus alleviating any need for use of a large high-speed digital filter that requires a bandwidth-limited input. According to one aspect of the invention, the decimating low-pass filter 202 is a random-walk filter.

The present invention has now been described in accordance with several exemplary embodiments, which are intended to be illustrative in all aspects, rather than restrictive.

Thus, the present invention is capable of many variations in detailed implementation, which may be derived from the description contained herein by a person of ordinary skill in the art. For example the phase-mismatch can also be determined at the wafer-sort phase by the input of a high-frequency sine wave with access to the ADC output data. The phase-mismatch detector need not be on the chip. The phase-mismatch could also be determined at "link-up" and locked in fore-ground calibration.

More than two ADC's can be calibrated if the ADCs are grouped in pairs. For example, if there are 4 ADCs in parallel, one could match ADC0 and ADC1. Then match ADC1 and ADC2, then use this technique to match the pairs of ADC. That is, match the pair ADC0, ADC1 to the pair ADC 1, ADC2. This technique can be further extended to any number of time interleaved channels, when the number of ADC's are an even number.

All such variations are considered to be within the scope and spirit of the present invention as defined by the following claims and their legal equivalents.

What is claimed:

1. A time-interleaved analog-to-digital converter (ADC) comprising:
    a plurality of ADC units, each ADC unit configured to sample an analog input signal according to a respective clock signal and generate a digital output signal;
    a multiplexor coupled to receive the digital output signals from respective ones of the plurality of ADC units, wherein the multiplexor is configured to selectively output each of the respective digital output signals from the ADC units in a sequence;
    a control circuit configured to receive a digital signal indicative of a timing mismatch between at least two of the respective digital output signals from the ADC units and further configured to generate an analog control signal as a function of the timing mismatch; and
    a clock generator configured to generate the respective clock signals for the ADC units and further configured to receive the analog control signal and adjust at least one of the respective clock signals based, at least in part, on the analog control signal to reduce the timing mismatch.

2. The time-interleaved ADC of claim 1, wherein the digital signal indicative of the timing mismatch has a first sampling rate, and wherein the control circuit is further configured to generate the analog control signal at a second sampling rate that is lower than the first sampling rate.

3. The time-interleaved ADC of claim 1, wherein the control circuit comprises a decimating filter configured to receive the digital signal indicative of the timing mismatch and reduce a sampling rate of the digital signal.

4. The time-interleaved ADC of claim 3, wherein the decimating filter comprises a random walk filter.

5. The time-interleaved ADC of claim 3, further comprising a digital-to-analog converter (DAC) coupled to the decimating filter and configured to convert a digital output signal of the decimating filter into an analog output signal.

6. The time-interleaved ADC of claim 1, wherein the digital signal indicative of a timing mismatch is further indicative of a correction current, and wherein the clock generator is further configured to generate the correction current to reduce the timing mismatch.

7. The time-interleaved ADC of claim 1, wherein the clock generator comprises:
    a first clock path having a first delay and configured to generate a first one of the respective clock signals based, at least in part, on the first delay and a reference clock signal;
    a second clock path having a second delay and configured to generate a second one of the respective clock signals based, at least in part, on the second delay and the reference clock signal; and
    CMOS circuitry coupled to the first and second clock paths and configured to receive a first signal based, at least in part, on the reference clock signal and a second signal based on the analog control signal from the control circuit, wherein the CMOS circuitry is further configured to set the first and second delays based on the received first and second signals.

8. The time-interleaved ADC of claim 1, further comprising a detector coupled to the multiplexor and configured to receive each of the respective digital output signals from the Ai)C units in the sequence, wherein the detector is further configured to detect the timing mismatch between at least two of the respective digital output signals and generate the digital signal indicative of the timing mismatch.

9. The time-interleaved ADC of claim 8, wherein the detector is further configured to generate the digital signal during a wafer-sort process.

10. The time-interleaved ADC of claim 8, wherein the detector is further configured to generate the digital signal during a link-up time.

11. A clock generator comprising:
    a first clock path having a first delay and coupled to receive a reference clock signal, wherein the first clock path is configured to generate a first clock signal based, at least in part, on the reference clock signal and the first delay, and wherein the first clock path is further configured to couple the first clock signal to a first ADC unit;
    a second clock path having a second delay and coupled to receive the reference clock signal, wherein the second clock path is configured to generate a second clock signal based, at least in part, on the reference clock signal and the second delay, and wherein the second clock path is further configured to couple the second clock signal to a second ADC unit; and
    control circuitry configured to receive a digital signal indicative of a timing mismatch between output signals of the first and second ADC units and further configured to generate an analog control signal as a function of the timing mismatch, wherein the control circuitry includes at least one CMOS circuit configured to adjust at least one of the first or second delays based, at least in part, on the analog control signal.

12. The clock generator of claim 11, wherein the digital signal has a first sampling rate, and wherein the control circuitry is further configured to generate the analog control signal at a second sampling rate that is lower than the first sampling rate.

13. The clock generator of claim 11, further comprising a common mode logic buffer coupled to receive the reference clock signal and configured to generate and output a source line control signal to the at least one CMOS circuit.

14. The clock generator of claim 11, wherein the digital signal has a first sampling rate, and wherein the control circuitry further comprises a decimating filter configured to receive the digital signal and generate a digital output signal having a second sampling rate that is lower than the first sampling rate.

15. The clock generator of claim 14, wherein the decimating filter comprises a decimating low-pass filter.

16. The clock generator of claim 14, wherein the decimating filter comprises a random walk filter.

17. The clock generator of claim 14, wherein the control circuitry further comprises a DAC coupled to receive the digital output signal from the decimating filter and configured to convert the digital output signal into an analog output signal.

18. The clock generator of claim 11, wherein the first ADC unit is configured to sample an analog input signal according to the first clock signal and the second ADC unit is configured to sample the analog input signal according to the second clock signal.

19. The clock generator of claim 11, wherein the digital signal indicative of a timing mismatch is farther indicative of a correction current and wherein the control circuitry is further configured to generate the correction current to adjust at least one of the first and second delays and reduce the timing mismatch.

20. The clock generator of claim 11, further comprising a detector configured to receive respective output signals from the first and second ADC units and detect a timing mismatch between the respective output signals, wherein the detector is further configured to generate the digital signal as a function of the timing mismatch.

* * * * *

UNITED STATES PATENT AND TRADEMARK OFFICE
CERTIFICATE OF CORRECTION

| | | |
|---|---|---|
| PATENT NO. | : 7,999,708 B2 | Page 1 of 1 |
| APPLICATION NO. | : 12/631531 | |
| DATED | : August 16, 2011 | |
| INVENTOR(S) | : Dyer | |

It is certified that error appears in the above-identified patent and that said Letters Patent is hereby corrected as shown below:

Column 4, line 15, in Claim 8, delete "Ai)C" and insert -- ADC --.

Column 5, line 10, in Claim 19, delete "farther" and insert -- further --.

Signed and Sealed this

Seventh Day of February, 2012

David J. Kappos
*Director of the United States Patent and Trademark Office*